(12) United States Patent
Shih et al.

(10) Patent No.: US 8,409,945 B2  
(45) Date of Patent: Apr. 2, 2013

(54) METHOD OF FABRICATING A CHARGE TRAPPING NON-VOLATILE MEMORY CELL

(75) Inventors: Hung-Lin Shih, Hsinchu (TW); Tsan-Chi Chu, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 58 days.

(21) Appl. No.: 12/985,322

(22) Filed: Jan. 5, 2011

(65) Prior Publication Data

US 2011/0097866 A1    Apr. 28, 2011

Related U.S. Application Data

(62) Division of application No. 12/104,452, filed on Apr. 17, 2008, now Pat. No. 7,902,587.

(51) Int. Cl.  
*H01L 21/8234*   (2006.01)  
*H01L 21/8247*   (2006.01)

(52) U.S. Cl. ............... 438/216; 257/315; 257/E21.422; 257/E21.416

(58) Field of Classification Search ............. 438/216; 257/E21.422, 314, 315, E21.416  
See application file for complete search history.

(56) References Cited

U.S. PATENT DOCUMENTS

| 5,714,412 | A   |   | 2/1998  | Liang |
|---|---|---|---|---|
| 6,462,375 | B1 |   | 10/2002 | Wu |
| 6,706,599 | B1 | * | 3/2004  | Sadd et al. ............... 438/261 |
| 6,835,621 | B2 |   | 12/2004 | Yoo |
| 7,042,045 | B2 |   | 5/2006  | Kang |
| 7,049,189 | B2 |   | 5/2006  | Chang |
| 7,242,612 | B2 | * | 7/2007  | Jung ................. 365/185.03 |
| 7,405,441 | B2 | * | 7/2008  | Deppe et al. ............ 257/314 |
| 2003/0178671 | A1 |   | 9/2003 | Takahashi |
| 2004/0183126 | A1 | * | 9/2004 | Bae et al. ............... 257/324 |
| 2005/0176203 | A1 | * | 8/2005 | Chang et al. ........... 438/261 |
| 2006/0068546 | A1 |   | 3/2006 | Chang |
| 2006/0214219 | A1 | * | 9/2006 | Choi et al. ............. 257/315 |
| 2006/0226466 | A1 |   | 10/2006 | Schuler |

\* cited by examiner

*Primary Examiner* — Jerome Jackson, Jr.  
*Assistant Examiner* — Paul Budd  
(74) *Attorney, Agent, or Firm* — Winston Hsu; Scott Margo

(57) ABSTRACT

A method of fabricating a non-volatile memory cell is disclosed. The method includes the steps of: forming two separate charge trapping structures on a semiconductor substrate; forming first spacers on sidewalls of the two charge trapping structures; forming a gate dielectric layer on the substrate; forming a gate on the two charge trapping structures and the gate dielectric layer between the two charge trapping structures; and forming two doped regions in the substrate beside the gate.

5 Claims, 4 Drawing Sheets

METHOD OF FABRICATING A CHARGE TRAPPING NON-VOLATILE MEMORY CELL

CROSS REFERENCE TO RELATED APPLICATIONS

This application is a division of U.S. application Ser. No. 12/104,452 filed Apr. 17, 2008, and incorporated herein by reference in its entirety.

BACKGROUND OF THE INVENTION

1. Field of the Invention

This invention relates to a semiconductor structure and a method of fabricating the same. More particularly, this invention relates to a structure of a non-volatile memory cell and a method of fabricating the same.

2. Description of the Prior Art

A non-volatile memory provides the property of multiple entries, retrievals and erasures of data, and is able to retain the stored information even when the electrical power is off. As a result, non-volatile memory is widely used in personal computers and consumer electronic products.

The family of non-volatile memory includes the substrate/oxide/nitride/oxide/silicon (SONOS) memory. The silicon nitride layer in the oxide-nitride-oxide (ONO) composite layer serves as a charge trapping layer.

In the programming of a SONOS memory cell, hot electrons injected into the charge trapping layer are not evenly distributed in the entire charge trapping layer but localized in a certain region of the charge trapping layer. In the erasing of the SONOS memory cell, hot holes are injected into the charge trapping layer locally to eliminate the stored electrons. However, since the injection region of the hot holes is smaller than that of the hot electrons, the SONOS memory cell cannot be completely erased. Therefore, after multiple programming-erasing cycles, the performance of the memory cell is reduced and even errors may occur during the operation of the memory cell.

SUMMARY OF THE INVENTION

Accordingly, this invention provides a method of fabricating a non-volatile memory cell that can prevent the memory cell from being erased incompletely.

This invention also provides a non-volatile memory cell with higher performance that can be fabricated with the above method of this invention.

The method of fabricating a non-volatile memory cell of this invention is described as follows. Two separate charge trapping structures are formed on a semiconductor substrate. First spacers are formed on the sidewalls of the two charge trapping structures. A gate dielectric layer is formed on the substrate. A gate is formed on the two charge trapping structures and the gate dielectric layer therebetween. Two doped regions are formed in the substrate beside the gate.

In an embodiment of the above method, the step of forming the gate includes forming over the substrate a conductive layer covering the charge trapping structures and the gate dielectric layer, and successively patterning the conductive layer and the charge trapping structures to form the gate. In another embodiment, the conductive layer is patterned without patterning the two charge trapping structures.

The non-volatile memory cell of this invention includes a semiconductor substrate, two separate charge trapping structures on the substrate, first spacers at least on opposite sidewalls of the two charge trapping structures, a gate dielectric layer on the substrate between the charge trapping structures, a gate on the charge trapping structures and the gate dielectric layer, and two doped regions in the substrate beside the gate.

In this invention, the non-volatile memory cell with two separate charge trapping structures not only can prevent the memory cell from being erased incompletely but also can improve the operation performance of the memory cell.

In order to make the above and other objects, features and advantages of this invention more comprehensible, several embodiments accompanied with figures are described in detail below.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1E'-1F' schematically illustrate, in the cross-sectional view, the remaining part of the process flow of fabricating a non-volatile memory cell according to the second embodiment of this invention.

DETAILED DESCRIPTION

FIGS. 1A-1D schematically illustrate, in a cross-sectional view, the common part of two process flows of fabricating a non-volatile memory cell respectively according to the first and second embodiments of this invention.

Figure 1A:
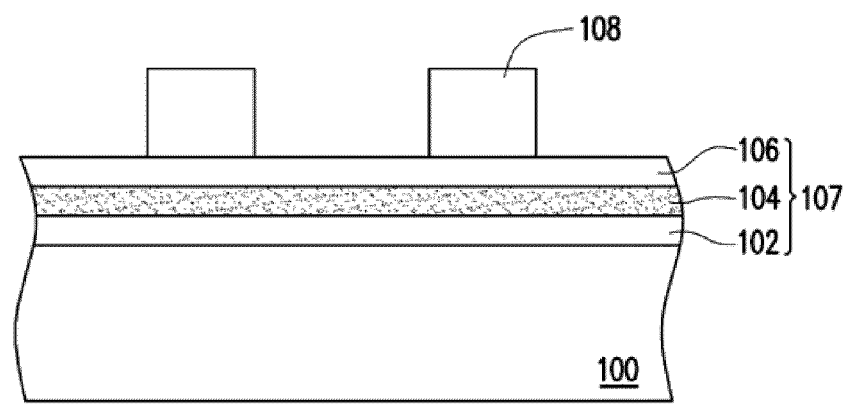
FIGS. 1A-1D schematically illustrate, in a cross-sectional view, the common part of two process flows of fabricating a non-volatile memory cell respectively according to the first and second embodiments of this invention.

Referring to FIG. 1A, a blanket charge trapping structure 107 is formed on a semiconductor substrate 100, such as a silicon substrate. The blanket charge trapping structure 107 may include a bottom oxide layer 102, a nitride layer 104 and a top oxide layer 106. For example, the bottom oxide layer 102 may be formed through thermal oxidation or chemical vapor deposition (CVD). The nitride layer 104, which is to be defined into a charge trapping layer, may be formed through LPCVD or PECVD. The top oxide layer 106 may be formed through surface oxidation of the nitride layer 104 or through CVD. Thereafter, a patterned mask layer 108, such as a patterned photoresist layer, is formed on the blanket charge trapping structure 107.

Figure 1B:
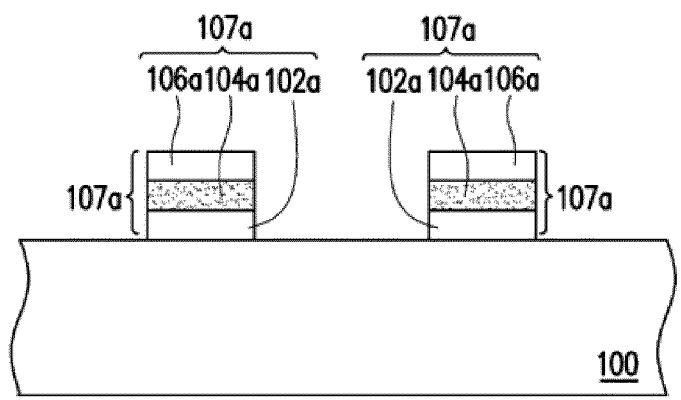

Referring to FIG. 1B, an etching process is performed using the patterned mask layer 108 as a mask to the blanket charge trapping structure 107 to pattern the blanket charge trapping structure 107 into two separate charge trapping structures 107a. Each charge trapping structure 107a may include a bottom oxide layer 102a on the substrate 100, a nitride trapping layer 104a on the bottom oxide layer 102a and a top oxide layer 106a on the nitride layer 104a. The patterned mask layer 108 is then removed.

Figure 1C:
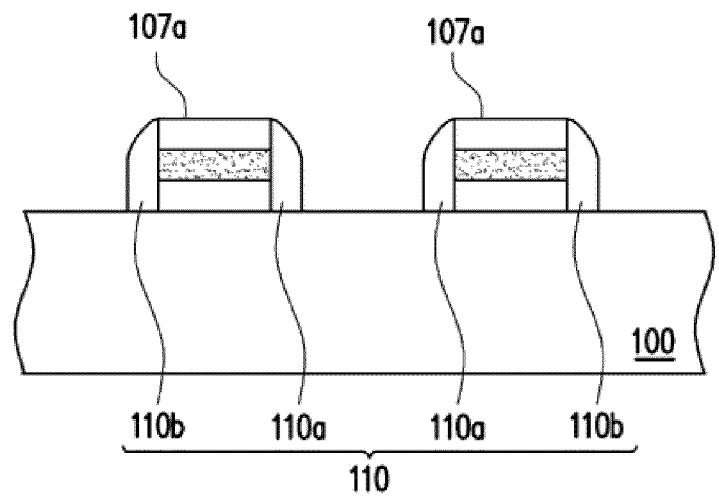

Referring to FIG. 1C, first spacers 110 are formed on the sidewalls of the two charge trapping structures 107a. The method of forming the first spacers 110 is, for example, depositing a spacer material layer over the substrate 100 and then removing a portion thereof by anisotropic etching. The spacer material layer may include silicon nitride (SiN), silicon oxide (SiO) or silicon oxynitride (SiON), for example. It is noted that the first spacers on the opposite sidewalls of the two charge trapping structures 107a are labeled with "110a" and those on the other sidewalls labeled with "110b".

Figure 1D:
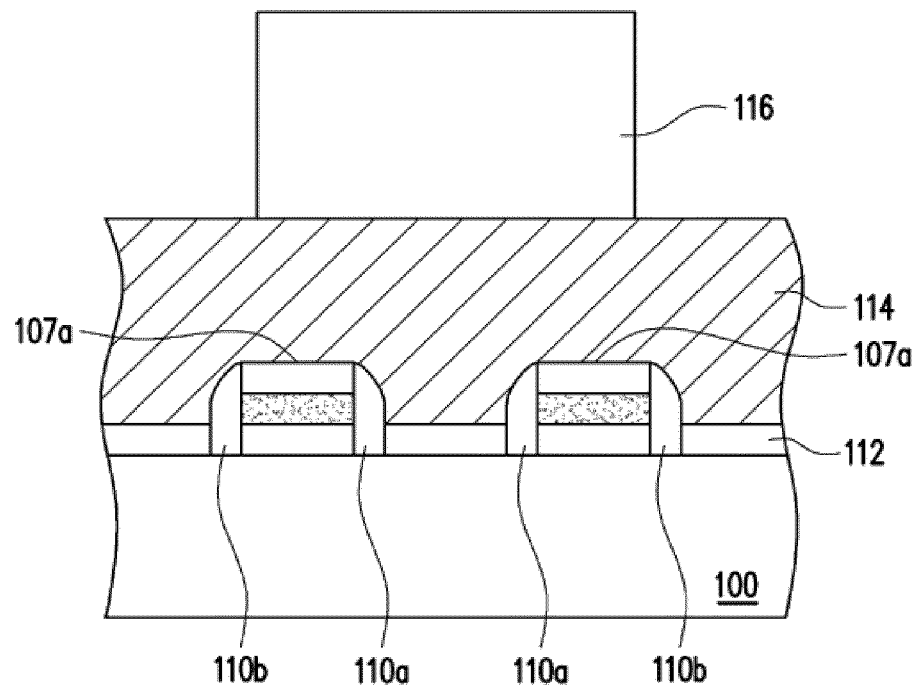

Referring to FIG. 1D, a gate dielectric layer 112 is formed on the substrate 100, possibly being a silicon oxide layer formed through thermal oxidation. A conductive layer 114 is then formed over the substrate covering the two charge trapping structures 107a and the gate dielectric layer 112. The conductive layer 114 may be a doped polysilicon layer formed with CVD, for example. Then, a patterned mask layer 116, such as a patterned photoresist layer, is formed on the conductive layer 114 covering a portion of the two charge trapping structures 107a. According to this invention, the gate dielectric layer 112 and the conductive layer 114 formed in the memory cell region as shown in FIG. 1D can be the same layers for forming the gate dielectric layers and the gates of the devices in the peripheral logic device region. Herein, it is for sure that the blanket charge trapping structure in the peripheral logic device region is removed in the aforementioned step of patterning the blanket charge trapping structure 107. Similarly, the following fabricating steps of the memory cells can be integrated with the corresponding fabricating steps of the peripheral logic devices.

Afterwards, an etching process is performed using the patterned mask layer 116 as a mask to the conductive layer 114. The etching process can be performed in two different ways as respectively described in the following two embodiments.

First Embodiment

Figure 1E:
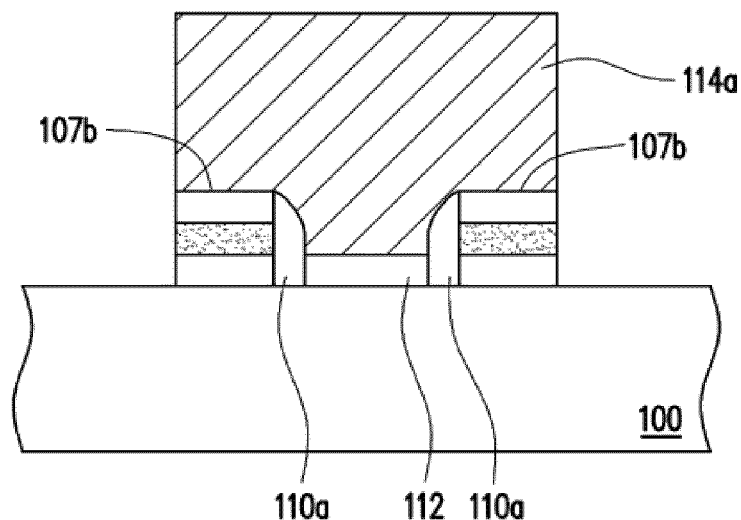
FIGS. 1E-1F schematically illustrate, in the cross-sectional view, the remaining part of the process flow of fabricating a non-volatile memory cell according to the first embodiment of this invention.
Figure 1F:
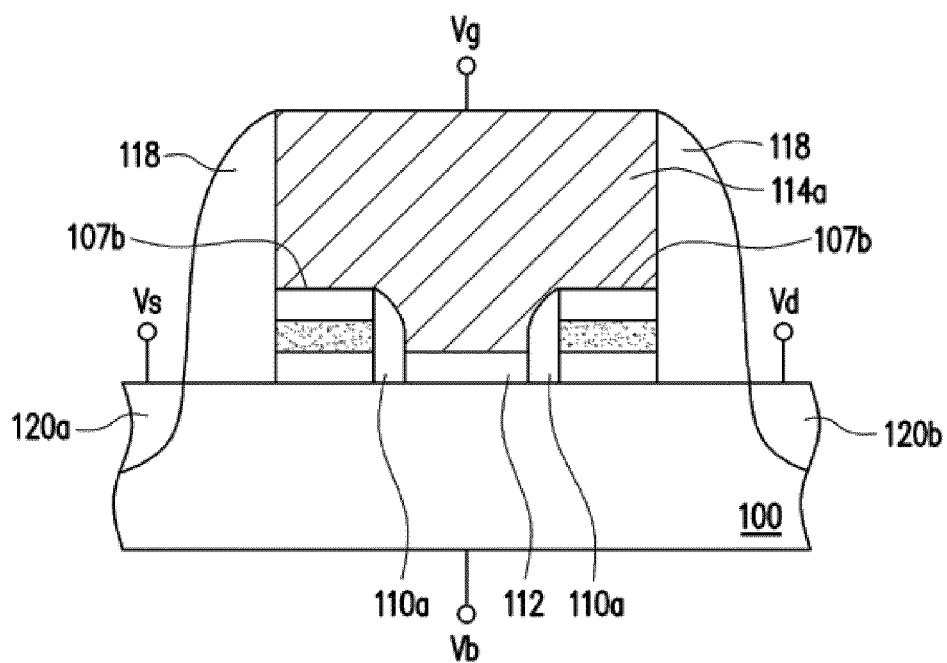
Figure 1E:
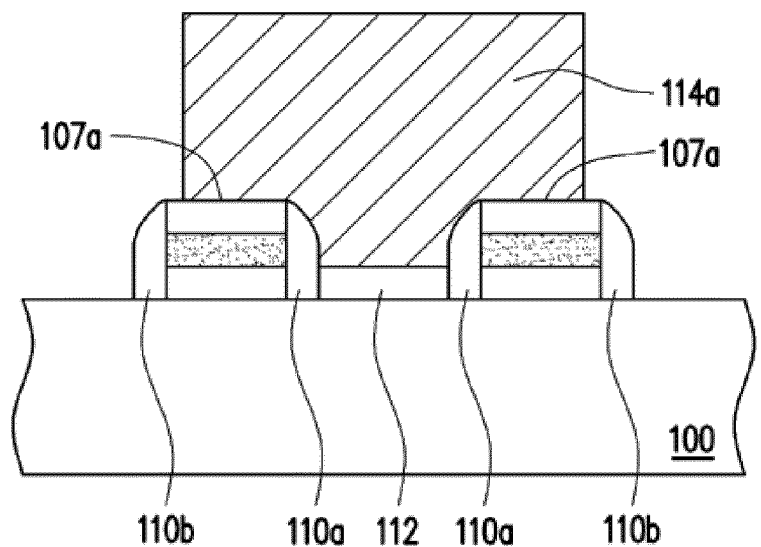
Figure 1F:
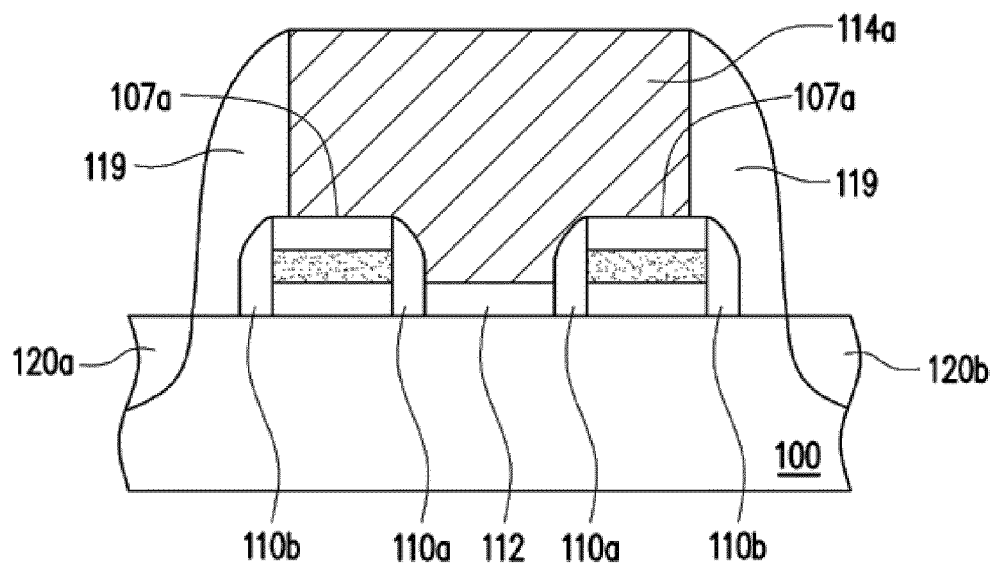

FIGS. 1E-1F schematically illustrate, in the cross-sectional view, the remaining part of the process flow of fabricating a non-volatile memory cell according to the first embodiment of this invention.

Referring to FIG. 1E, in this embodiment, the etching process using the patterned mask layer 116 (FIG. 1D) as a mask is performed to the conductive layer 114 and to the charge trapping structures 107a successively, so that a gate 114a is formed as well as a portion of the charge trapping structures 107a and the first spacers 110b are removed. The gate 114a covers the remaining charge trapping structures 107b and the gate dielectric layer 112 between the same. Then, the patterned mask layer 116 is removed.

Referring to FIG. 1F, a second spacer 118 is formed beside the gate 114a and two charging trapping structures 107b on the substrate 100. The method of forming the second spacer 118 is, for example, depositing a spacer material layer over the substrate 100 and then removing a portion thereof through anisotropic etching. The spacer material layer may include SiN, SiO or SiON, for example. Thereafter, two doped regions 120a and 120b as source/drain regions are formed in the substrate 100 beside the gate 114a. The two doped regions 120a and 120b are formed, for example, with an ion implantation process that implants an N-type or P-type dopant in the substrate 100.

According to the first embodiment of this invention, the meory cell includes a semiconductor substrate 100, two charge trapping structures 107b, first spacers 110a, a gate dielectric layer 112, a gate 114a, a second spacer 118 and two doped regions 120a and 120b. The two charge trapping structures 107b are separated from each other on the substrate 100. The first spacers 110a are disposed on the opposite sidewalls of the two charge trapping structures 107b. The gate dielectric layer 112 is disposed on the substrate 100 between the two charge trapping structures 107b. The gate 114a is disposed on the two charge trapping structures 107b and the gate dielectric layer 112, wherein the sidewalls of the gate 114a are aligned with corresponding sidewalls of the two charge trapping structures 107b. The second spacer 118 is disposed on the substrate 100 beside the gate 114a and two charging trapping structures 107b. The two doped regions 120a and 120b are disposed in the substrate 100 beside the gate 104a.

Second Embodiment

FIGS. 1E'-1F' schematically illustrate, in the cross-sectional view, the remaining part of the process flow of fabricating a non-volatile memory cell according to the second embodiment of this invention.

Referring to FIG. 1E', in this embodiment, the etching process using the patterned mask layer 116 (FIG. 1D) as a mask is performed to the conductive layer 114 to form a gate 114a, without substantially patterning the two charge trapping structures 107a. As a result, the gate 114a covers a portion of the two charge trapping structures 107a and the gate dielectric layer 112 between the same. Thereafter, the patterned mask layer 116 is removed.

Referring to FIG. 1F', a second spacer 119 is formed on the substrate 100 beside the gate 114a and the first spacers 110b of the two charging trapping structures 107a. The material of the second spacer 119 is SiN, SiO or SiON, for example. The method of forming the second spacer 119 may be the same as that of forming the second spacer 118 in the first embodiment. Then, two doped regions 120a and 120b as source/drain regions are formed in the substrate 100 beside the gate 114a. The method of forming the doped regions 120a/b may be the same as that provided in the first embodiment.

According to the second embodiment of this invention, the meory cell includes a semiconductor substrate 100, two charge trapping structures 107a, first spacers 110a and 110b, a gate dielectric layer 112, a gate 114a, a second spacer 119 and two doped regions 120a and 120b. The two charge trapping structures 107a are separated from each other on the substrate 100. The first spacers 110a are disposed on the opposite sidewalls of the two charge trapping structures 107a, and the spacers 110b on the other sidewalls of the same. The gate dielectric layer 112 is disposed on the substrate 100 between the two charge trapping structures 107a. The gate 114a is disposed on the two charge trapping structures 107a and the gate dielectric layer 112. The second spacer 119 is disposed on the substrate 100 beside the gate 114a and the first spacers 110b of the two charging trapping structures 107a. The two doped regions 120a and 120b are disposed in the substrate 100 beside the gate 114a.

Moreover, exemplary operation of the non-volatile memory cell of this invention is introduced, with the non-volatile memory cell depicted in FIG. 1F as an example. Referring to FIG. 1F, the doped regions 202a and 202b respectively serve as a source region and a drain region here. The voltages applied to the gate 114a, the source region 120a, the drain region 120b and the substrate 100 are designated as Vg, Vs, Vd and Vb, respectively. When the programming is performed with CHEI (channel hot electron injection), for example, Vg is 6V, Vd is 4V, and Vs and Vb both are at the ground level. When the erasing is performed with BTBTHH (band-to-band tunneling hot holes) injection, for example, Vg is −3V, Vd is 6V, and Vs and Vb both are at the ground level. The erasing may alternatively be done by FN hole tunneling, wherein Vg is −6V, Vb is 6V, and Vs and Vd both are at the ground level, for example.

Accordingly, this invention divides the charge trapping layer of the non-volatile memory cell into two separate pieces, so that the injection region of hot electrons and that of hot holes both are confined in the pieces to prevent incomplete erasing. As a result, the performance of the memory cell is not lowered after repeated operations.

Moreover, the first spacers 110*a* on the opposite sidewalls of the two charge trapping structures can prevent current leakage between the nitride trapping layer 104*a* and the gate 114*a*.

Furthermore, the fabricating process of the non-volatile memory cell of this invention is compatible with a logic device process. That is, this invention can be integrated with a logic device process without an extra step or mask.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a non-volatile memory cell, comprising:
    forming two separate charge trapping structures on a semiconductor substrate;
    forming first spacers on sidewalls of the two charge trapping structures;
    forming a gate dielectric layer on the substrate;
    forming over the semiconductor substrate a conductive layer covering the two charge trapping structures and the gate dielectric layer;
    successively patterning the conductive layer and the two charge trapping structures to form a gate on the two charge trapping structures and the gate dielectric layer between the two charge trapping structures; and
    forming two doped regions in the substrate beside the gate.

2. The method of claim 1, wherein the step of forming the two separate charge trapping structures comprises:
    forming a blanket charge trapping structure on the substrate; and
    patterning the blanket charge trapping structure to form the two charge trapping structures.

3. The method of claim 1, wherein the charge trapping structures each comprise a bottom oxide layer, a top oxide layer and a nitride trapping layer between the bottom oxide layer and the top oxide layer.

4. The method of claim 1, further comprising forming a second spacer beside the gate and the two charge trapping structures.

5. The method of claim 1, wherein the first spacers comprise silicon nitride (SiN), silicon oxide (SiO) or silicon oxyniride (SiON).

\* \* \* \* \*